(12) United States Patent
Peng

(10) Patent No.: US 6,519,869 B2
(45) Date of Patent: Feb. 18, 2003

(54) METHOD AND APPARATUS FOR DRYING SEMICONDUCTOR WAFERS

(75) Inventor: Fu-Sheng Peng, Tao-Yuan (TW)

(73) Assignee: United Microelectronics, Corp. (TW)

( * ) Notice: Subject to any disclaimer, the term of this patent is extended or adjusted under 35 U.S.C. 154(b) by 45 days.

(21) Appl. No.: 09/854,960

(22) Filed: May 15, 2001

(65) Prior Publication Data

US 2002/0170202 A1 Nov. 21, 2002

(51) Int. Cl.⁷ .............. F26B 7/00; F26B 21/06; F26B 13/06
(52) U.S. Cl. .............. 34/487; 34/448; 34/470; 34/509; 34/68; 34/74; 34/632
(58) Field of Search .......... 34/448, 449, 467, 34/468, 469, 470, 487, 492, 509, 516, 68, 73, 74, 76, 84, 85, 630, 632, 633

(56) References Cited

U.S. PATENT DOCUMENTS

| | | | | |
|---|---|---|---|---|
| 5,351,419 A | * | 10/1994 | Franka et al. .............. 34/470 |
| 5,371,950 A | * | 12/1994 | Schumacher ................ 34/78 |
| 5,815,942 A | * | 10/1998 | Wu et al. .................... 34/78 |
| 5,950,328 A | * | 9/1999 | Ichiko et al. ................ 34/364 |
| 5,956,859 A | * | 9/1999 | Matsumoto et al. .......... 34/74 |
| 5,996,242 A | * | 12/1999 | Matsumoto et al. .......... 34/76 |
| 6,001,191 A | * | 12/1999 | Kamikawa et al. .......... 134/32 |
| 6,029,371 A | * | 2/2000 | Kamikawa et al. .......... 34/516 |
| 6,101,737 A | * | 8/2000 | Kinoshita ................... 34/340 |
| 6,134,807 A | * | 10/2000 | Komino et al. .............. 34/418 |
| 6,143,087 A | * | 11/2000 | Walter ........................ 134/1 |
| 6,161,300 A | * | 12/2000 | Kim ............................ 34/73 |
| 6,273,107 B1 | * | 8/2001 | Adams et al. .............. 134/102.1 |
| 6,289,605 B1 | * | 9/2001 | Chang ........................ 34/471 |
| 6,352,084 B1 | * | 3/2002 | Oshinowo ................... 134/182 |
| 6,439,247 B1 | * | 8/2002 | Kittle ......................... 134/102.1 |

* cited by examiner

Primary Examiner—Pamela Wilson
(74) Attorney, Agent, or Firm—Powell Goldstein Frazer & Murphy LLP

(57) ABSTRACT

A method and an apparatus for drying semiconductor wafers by using an IPA drying apparatus. The present invention uses a vapor generator to generate an IPA vapor. The IPA vapor is generated and saved in a closed surrounding and then transferred in a porous hollow plate in the dryer tank by using a quartz pipe. The IPA vapor is diffused evenly from the porous hollow plate. Furthermore, the present invention increases the safety of the process and can easily control the input amount of the IPA vapor.

20 Claims, 4 Drawing Sheets

METHOD AND APPARATUS FOR DRYING SEMICONDUCTOR WAFERS

BACKGROUND OF THE INVENTION

1. Field of the Invention

The present invention generally relates to a method and an apparatus for drying semiconductor wafers, and more particularly relates to a method and an apparatus for drying semiconductor wafers by using an IPA (isopropyl alcohol) drying apparatus.

2. Description of the Prior Art

Recently, IPA dryers have been used for the drying of semiconductor wafers, because, compared to a spin dryer, the semiconductor wafers incur less mechanical damage and a cleaner semiconductor wafer surface is obtainable.

A typical IPA drying apparatus is shown in FIG. 1. An IPA drying apparatus has an IPA dryer tank 100 to isolate the semiconductor wafers to reduce the water content contained in the semiconductor wafers. A plurality of semiconductor wafers 110, for example which have been washed after a wet etching step for example, are delivered by a mechanical arm to the IPA dryer tank 100 for drying and are supported by a holder 110. An IPA solution 120 is contained in the IPA dryer tank 100 and is heated by a heater 114 to its boiling point to generate an IPA vapor 122 in the IPA dryer tank 100. There are cooling or condensation coils 130 surrounding and disposed on the inner peripheral surface of the IPA dryer tank 100.

The IPA vapor 122 coats on semiconductor wafers 110 and combined with water thereon to become an IPA co-solution. When semiconductor wafers 110 rise to the level of cooling coils 130, the IPA co-solution is evaporated and water is removed from semiconductor wafers 110 at the same time. The IPA dryer tank 100 comprises a collecting tray 132 below cooling coils 130 which is mounted on the inner peripheral surface of the IPA dryer tank 100, to collect drips from cooling coils 130 and drain out from an outlet 134. The IPA dryer tank 100 further comprises an outlet 136 to exhaust the IPA vapor 122.

However, the IPA vapor 122 is continuously generated in the IPA dryer tank 100, and the IPA vapor 122 is continuously coating on semiconductor wafers 110. The disadvantage of the current IPA drying apparatus is that the continuously generated IPA vapor may contaminate dried semiconductor wafers again. Furthermore, the continuously generated IPA vapor causes production costs to increase.

SUMMARY OF THE INVENTION

The primary object of the invention is to provide a method for drying semiconductor wafers using an IPA drying apparatus.

Another object of the invention is to provide an apparatus for drying semiconductor wafers.

A further object of the invention is to easily control the input amount of the IPA vapor and increase the safety of the process.

In order to achieve the previous objects of the invention, a method comprising the following essential steps is provided. First, a solution is evaporated to generate a vapor, wherein the solution can generate a co-solution with water and the co-solution can evaporate at a temperature lower than 100. Then, a dryer tank is provided. Next, the vapor is piped to a porous hollow plate in the dryer tank. Last, at least one wafer is dried in the dryer tank, wherein the vapor is evenly diffused from the hollow porous plate.

Another embodiment is an apparatus for drying semiconductor wafers and the apparatus comprises the following elements. First, a vapor generator is used to generate a vapor. Second, a pipe is used to transfer the vapor, wherein one side of the pipe is connected to the vapor generator. Third, a dryer tank is used for drying wafers, wherein a porous hollow plate is on a bottom of the dryer tank and is connected to another side of the pipe. The porous hollow plate has a porous surface faced up in the dryer tank and the vapor is evenly diffused from the porous surface.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
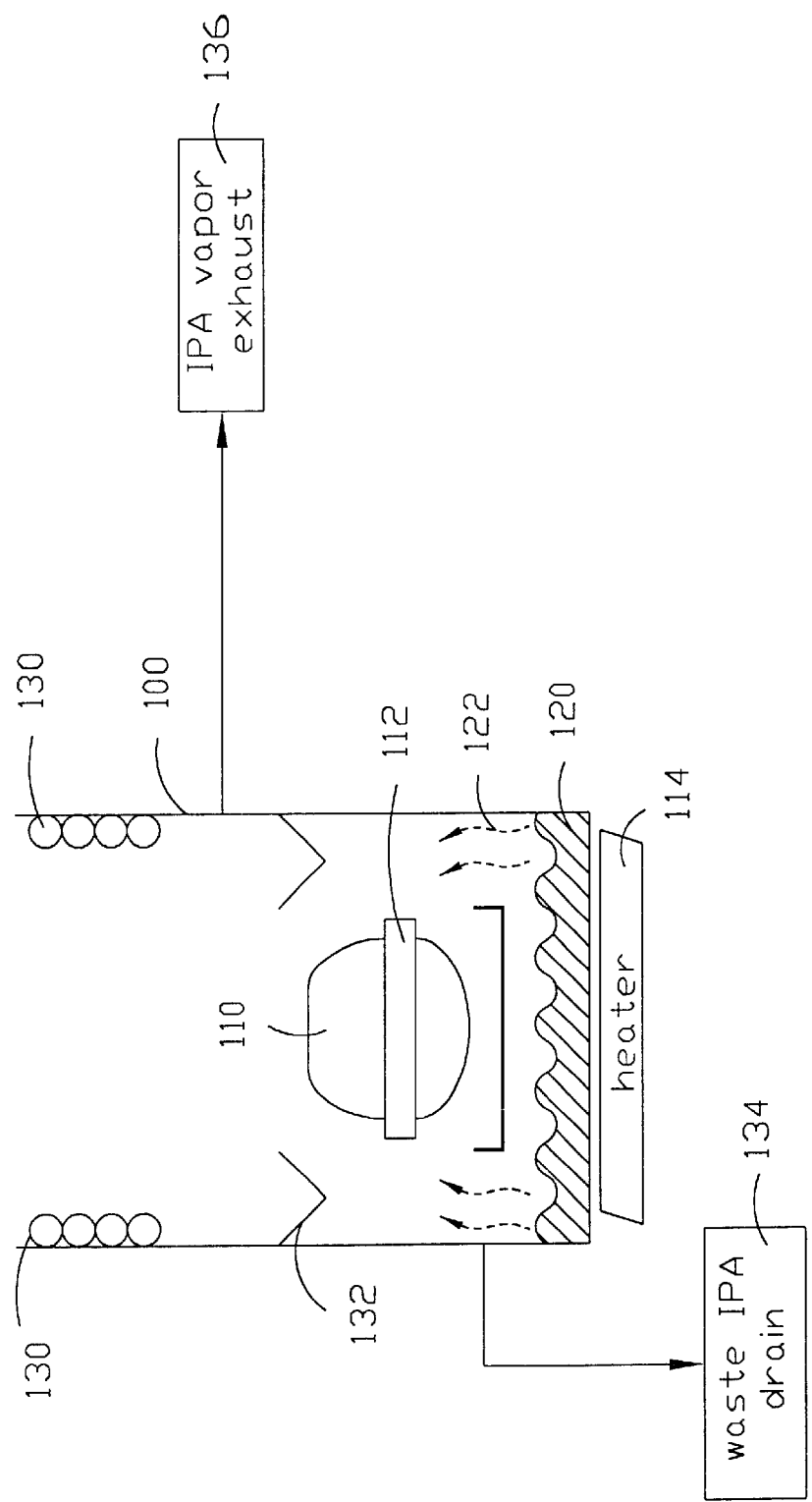
FIG. 1 is the schematic representation of the IPA drying apparatus in accordance with prior techniques.
Figure 2:
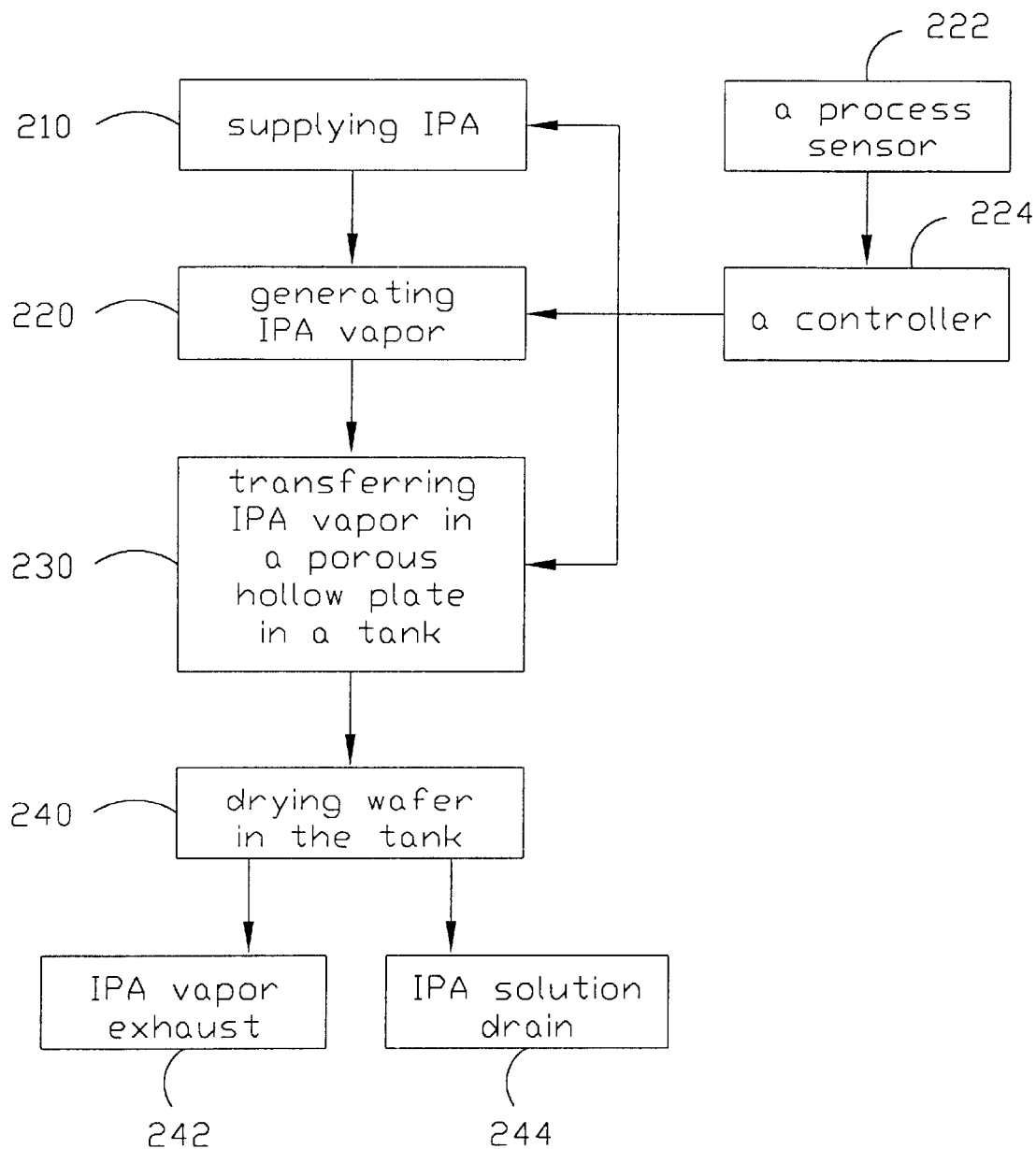
FIG. 2 is the flowchart of the present invention.

In this invention, a method was introduced to dry semiconductor wafers by using an IPA (isopropyl alcohol) drying apparatus. The present invention will be explained in detail in a flowchart, as shown in FIG. 2.

First, an IPA solution is provided (step 210) and transferred to an IPA vapor generator. Then, an IPA vapor is generated in the IPA vapor generator (step 220). The IPA solution is heated in the IPA vapor generator by a heater to its boiling point to generate an IPA vapor. Next, the IPA vapor is piped from the IPA vapor generator to a porous hollow plate in a dryer tank (step 230). The dryer tank is made of quartz. The IPA vapor is piped and keeps in gaseity-by using a quartz pipe. The porous hollow plate is on a bottom of the dryer tank and has a porous surface facing up in the dryer tank. The present invention can use a process sensor to set the process parameter (step 222). Then, the process parameter will be transferred to a controller to control the input amount of the IPA solution, the action of the IPA vapor generator, and the input amount of the IPA vapor (step 224).

Thereafter, a plurality of semiconductor wafers are delivered by a mechanical arm to the IPA dryer tank for drying and are supported by a holder. Then, these semiconductor wafers are dried in the dryer tank (step 240). The IPA vapor is evenly diffused from the porous surface of the porous hollow plate in the dryer tank. The IPA vapor coats on these semiconductor wafers and combines with the water thereon to become an IPA co-solution. Next, the IPA co-solution is evaporated and water is removed from the semiconductor wafers at the same time. Last, the excess IPA vapor will exhaust from an outlet of the dryer tank (step 242) and the condensed IPA solution will drain from another outlet of the dryer tank (step 244).

Figure 3:
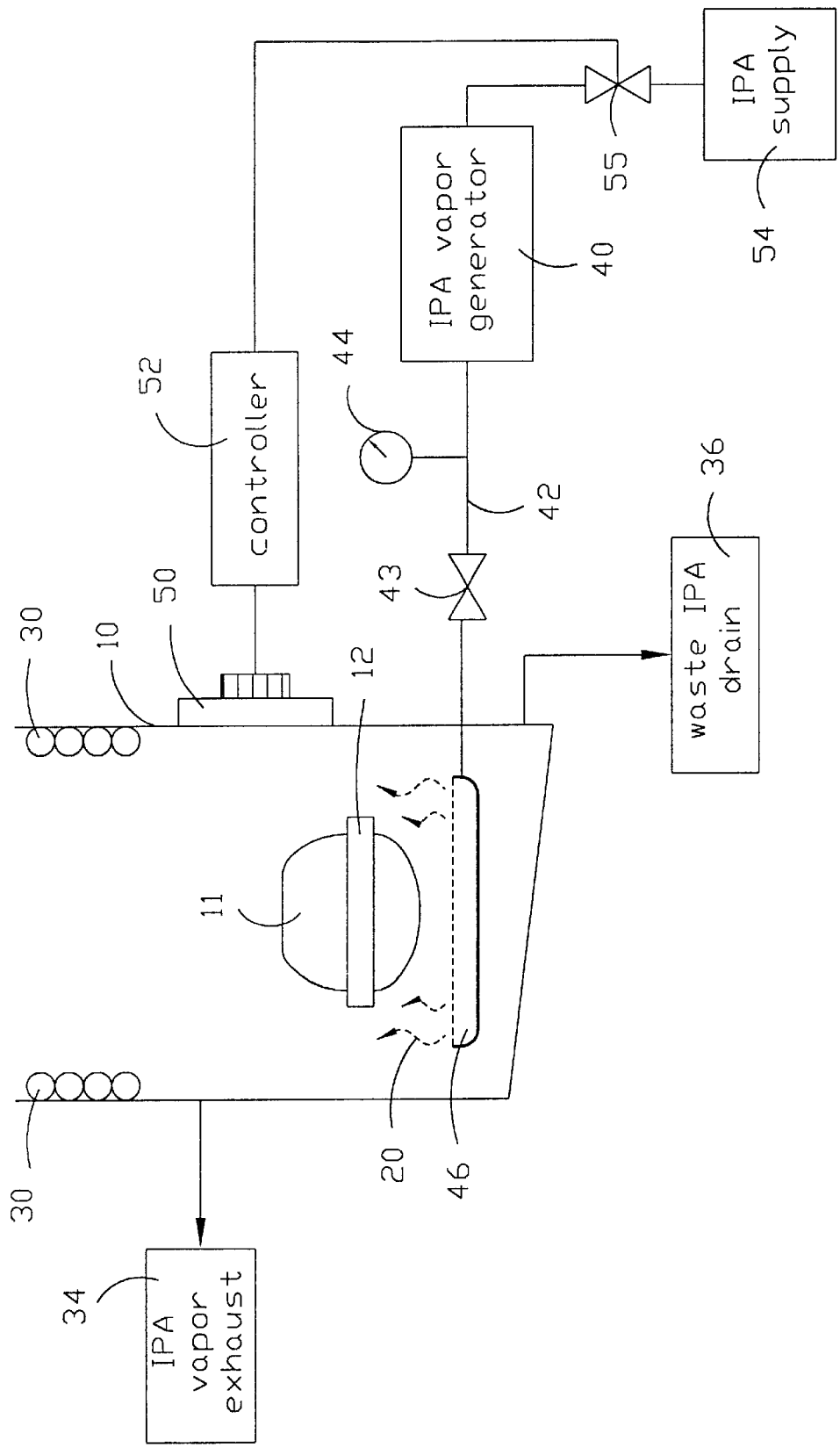
FIG. 3 is the schematic representation of the IPA drying apparatus, in accordance with the present invention.

Referring to FIG. 3, the present invention provides an apparatus for drying semiconductor wafers. The present apparatus is an improvement over the conventional IPA drying apparatus by its simple design. The IPA solution can be replaced by any solution which can be combined with water as a co-solution and the co-solution can evaporate at a temperature lower than 100 degrees. First, the present apparatus has a dryer tank 10, which is made of quartz. A plurality of semiconductor wafers 11 are delivered by a mechanical arm to the IPA dryer tank 10 for drying and are supported by a holder 12. There are many cooling or condensation coils 30 surrounded and disposed on the inner peripheral surface of the IPA dryer tank 10. There is a porous hollow plate 46 on a bottom of the dryer tank 10. The porous hollow plate 46 has a porous surface facing up in the dryer tank 10.

In the present invention, an IPA vapor for drying wafers 11 is generated and is saved in a closed system, such as an IPA vapor generator 40, and isolated with the dryer tank 10. The IPA solution is supplied from an IPA solution supplier 54. In the IPA vapor generator 40, the IPA solution is heated by a heater and to its boiling point to generate an IPA vapor. Furthermore, there is a liquid valve 55 to control the IPA solution into the vapor generator 40. Then, the IPA vapor is piped from the IPA vapor generator 40 to the porous hollow plate 46 in the dryer tank 10 by using a quartz pipe 42. The quartz pipe 42 further comprises a valve 43 and a pressure gauge 44 to monitor the pressure of the IPA vapor and to control the input amount of the IPA vapor.

Thereafter, the IPA vapor 20 is evenly diffused from the porous surface of the porous hollow plate. The IPA vapor 20 coats on semiconductor wafers 11 and the IPA vapor 20 combines with water thereon to become an IPA co-solution at 80. Next, semiconductor wafers 11 rise to the level of cooling coils 30, which is at 25, and then the IPA co-solution is evaporated and water is removed from semiconductor wafers 11 at the same time. Last, the excess IPA vapor will exhaust form an outlet 34 of the dryer tank and the condensed IPA solution will drain from an outlet 36 of the dryer tank. The outlet 36 can be designed with a lopsided bottom of the dryer tank 10 and the condensed IPA solution can easily drain from the lower outlet 36.

Figure 4:
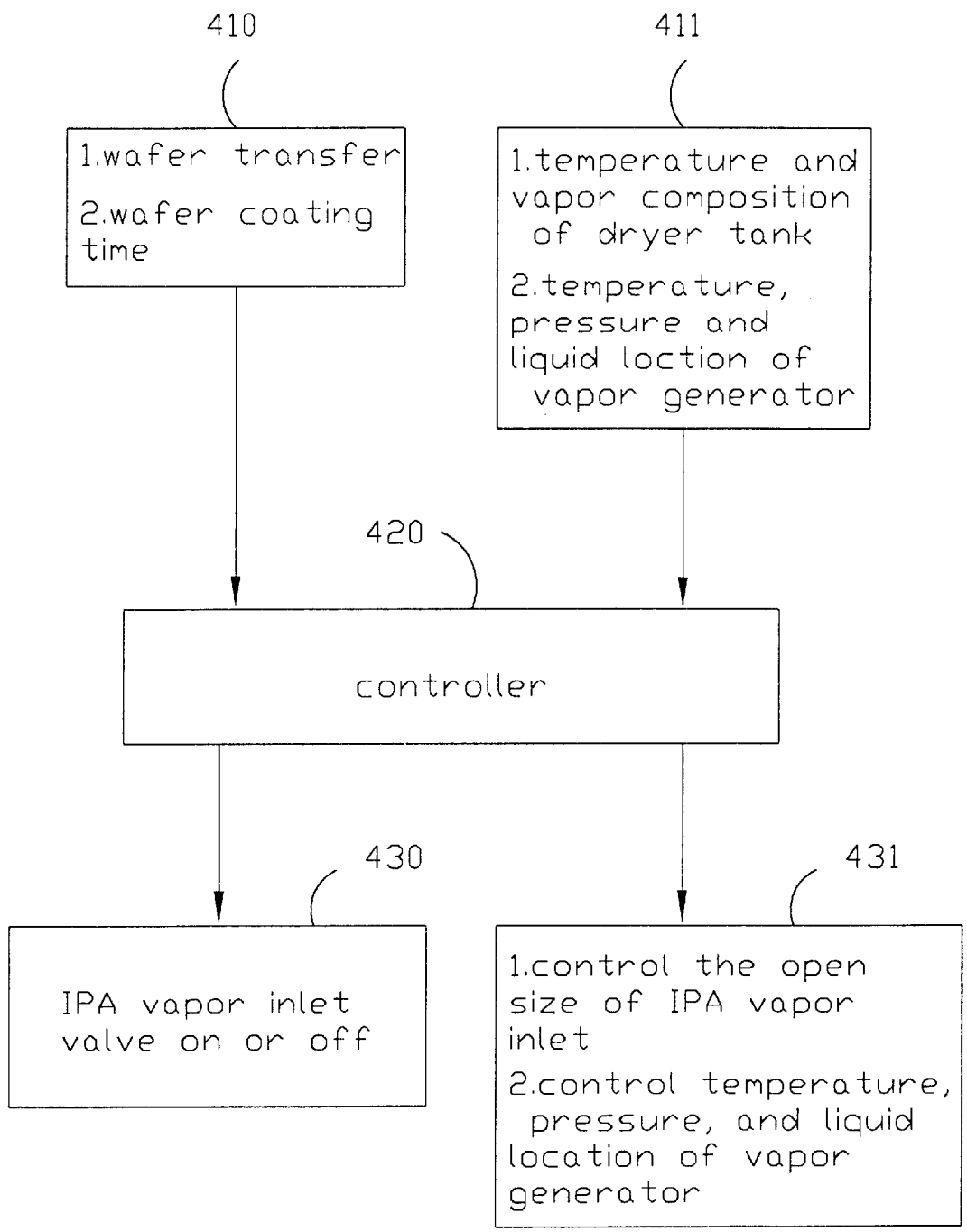
FIG. 4 is the functional block diagram of the controller of the present invention.

Furthermore, the present apparatus further comprises a controller 52 to control the input amount of the IPA solution, the action of the IPA vapor generator, and the input amount of the IPA vapor. The controller 52 is engaged by receiving the process parameters, which are monitored from a process sensor 50. The process sensor is an assembly of measuring or sampling tool. There is a simple block diagram of the controller in the FIG. 4. When the signal of the transfer of the wafer or the signal of the finish of coating wafer (block 410), which is monitored by the process sensor, are transferred to the controller (block 420), the controller is engaged to control the on or off of the inlet valve of the quartz pipe (block 430). When the signal of the temperature and vapor composition of the dryer tank or the signal of the temperature, pressure, and liquid location of the vapor generator (block 411), which is monitored by the process sensor, are transferred to the controller (block 420), the controller is engaged to control the open size of the inlet valve of the quartz pipe or to control the temperature, pressure, and liquid location of the vapor generator (block 430).

To sum up the foregoing, the present invention provides a method and an apparatus for dying wafers using an IPA drying apparatus. The present invention uses a closed system to generate and save the IPA vapor and then transfer the IPA vapor using a quartz pipe. Generating the IPA vapor in a closed system is safer for the process in the factory. Moreover, the present invention uses a pressure gauge to monitor the pressure of the IPA vapor and a valve to control the input amount of the IPA vapor. However, the present invention can easily control the using time of the IPA vapor and reduce the waste of the IPA vapor and the heating energy. Furthermore, the present invention can prevent the second pollution by the IPA vapor after drying those wafers and will not obstruct the next run of the generation of the IPA vapor.

Of course, it is to be understood that the invention need not be limited to these disclosed embodiments. Various modifications and similar changes are still possible within the spirit of this invention. In this way, the scope of this invention should be defined by the appended claims.

What is claimed is:

1. A method for drying semiconductor wafers by using drying apparatus, said method comprising:

evaporating a solution to generate a vapor, wherein said solution can generate a co-solution with water and said co-solution can evaporate at a temperature lower than 100° C.;

providing a dryer tank;

piping said vapor to a porous hollow plate in said dryer tank; and drying at least one wafer in said dryer tank, wherein said vapor is evenly diffused from said porous hollow plate.

2. The method according to claim 1, wherein said solution is an IPA (isopropyl alcohol) solution.

3. The method according to claim 1, wherein said dryer tank is made of quartz.

4. The method according to claim 1, wherein the step of piping said vapor is using a quartz pipe.

5. The method according to claim 4, further comprises a valve on said quartz pipe to control the input amount of said vapor.

6. The method according to claim 4, further comprises a pressure gauge on said quartz pipe.

7. The method according to claim 1, wherein said porous hollow plate is on a bottom of said dryer tank.

8. The method according to claim 1, wherein said porous hollow plate has a porous surface which is faced up.

9. A method for drying semiconductor wafers by using an IPA (isopropyl alcohol) drying apparatus, said method comprising:

evaporating an a IPA solution to generate an IPA vapor;

providing a dryer tank, wherein said dryer tank is made of quartz;

piping said IPA vapor from to a porous hollow plate on a bottom of said dryer tank by using a quartz pipe, wherein said porous hollow plate has a porous surface which is faced up; and drying at least one wafer in said dryer tank, wherein said IPA vapor is evenly diffused from said porous surface.

10. The method according to claim 9, further comprises a valve on said quartz pipe to control the input amount of said IPA vapor.

11. The method according to claim 9, further comprises a pressure gauge on said quartz pipe.

12. An apparatus for drying semiconductor wafers by using a drying apparatus, said apparatus comprising:

a vapor generator to generate a vapor;

a pipe to transfer said vapor, wherein one side of said pipe is connected to said vapor generator; and a dryer tank, wherein a porous hollow plate is on a bottom of said dryer tank and connected to another side of said pipe, wherein said porous hollow plate has a porous surface faced up in said dryer tank and said vapor is evenly diffused from said porous surface.

13. The apparatus according to claim 12, wherein said vapor is an IPA(isopropyl alcohol) vapor.

14. The apparatus according to claim 12, wherein said dryer tank is made of quartz.

15. The apparatus according to claim 12, wherein said pipe is made of quartz.

16. The apparatus according to claim 12, further comprises a valve on said pipe to control the input amount of said vapor.

17. The apparatus according to claim 12, further comprises a pressure gauge on said pipe.

18. An apparatus for drying semiconductor wafers by using an IPA (isopropyl alcohol) drying apparatus, said apparatus comprising:

a vapor generator to generate an IPA vapor;

a pipe to transfer said IPA vapor, wherein one side of said pipe is connected to said vapor generator, wherein said pipe further comprises a valve and a pressure gauge on said pipe to control the input amount of said IPA vapor; and a dryer tank, wherein a porous hollow plate is on a bottom of said dryer tank and connected to another side of said pipe, wherein said porous hollow plate has a porous surface faced up in said dryer tank and said vapor is evenly diffused from said porous surface.

19. The apparatus according to claim 18, wherein said dryer tank is made of quartz.

20. The apparatus according to claim 18, said pipe is made of quartz.

* * * * *